United States Patent
Kitami et al.

(10) Patent No.: US 11,694,877 B2
(45) Date of Patent: Jul. 4, 2023

(54) NEGATIVE ION IRRADIATION DEVICE

(71) Applicant: SUMITOMO HEAVY INDUSTRIES, LTD., Tokyo (JP)

(72) Inventors: Hisashi Kitami, Kanagawa (JP); Toshiyuki Sakemi, Kanagawa (JP); Tetsuya Yamamoto, Kochi (JP)

(73) Assignee: SUMITOMO HEAVY INDUSTRIES, LTD., Tokyo (JP)

(*) Notice: Subject to any disclaimer, the term of this patent is extended or adjusted under 35 U.S.C. 154(b) by 268 days.

(21) Appl. No.: 16/913,620

(22) Filed: Jun. 26, 2020

(65) Prior Publication Data

US 2020/0411295 A1 Dec. 31, 2020

(51) Int. Cl.
*H01J 37/32* (2006.01)
*C23C 14/48* (2006.01)
*C23C 14/58* (2006.01)
*C23C 14/54* (2006.01)

(52) U.S. Cl.
CPC ........ *H01J 37/32449* (2013.01); *C23C 14/48* (2013.01); *C23C 14/54* (2013.01); *C23C 14/541* (2013.01); *C23C 14/5826* (2013.01); *H01J 2237/327* (2013.01)

(58) Field of Classification Search
CPC ........... H01J 37/32449; H01J 37/32422; H01J 2237/327
See application file for complete search history.

(56) References Cited

U.S. PATENT DOCUMENTS

| 10,648,074 B2 * | 5/2020 | Hoffman | C23C 14/3471 |
| 2018/0358213 A1 | 12/2018 | Ruzic et al. | |
| 2019/0338411 A1 * | 11/2019 | Hoffman | H01J 37/34 |

(Continued)

FOREIGN PATENT DOCUMENTS

| CN | 102222613 A | * | 10/2011 | ....... H01L 21/02164 |
| CN | 107849690 A | * | 3/2018 | ............. C23C 14/32 |
| CN | 107849690 A | | 3/2018 | |

(Continued)

OTHER PUBLICATIONS

Machine Translation CN107849690A (Year: 2018).*

(Continued)

*Primary Examiner* — Raymond R Chai
(74) *Attorney, Agent, or Firm* — Michael Best & Friedrich LLP

(57) ABSTRACT

Provided is a negative ion irradiation device in which an object is irradiated with a negative ion. The device includes a chamber that allows the negative ion to be generated therein, a gas supply unit that supplies a gas which is a raw material for the negative ion, a plasma generating portion that generates plasma, a voltage applying unit that applies a voltage to the object, a control unit that performs control of the gas supply unit, the plasma generating portion, and the voltage applying unit. The control unit controls the gas supply unit to supply the gas into the chamber, controls the plasma generating portion to generate the plasma in the chamber and to generate the negative ion by stopping the generation of the plasma, and controls the voltage applying unit to start voltage application during plasma generation and to continue voltage application after plasma generation stop.

2 Claims, 6 Drawing Sheets

(56) References Cited

U.S. PATENT DOCUMENTS

2022/0165546 A1* 5/2022 Lill .................. H01J 37/32082

FOREIGN PATENT DOCUMENTS

| JP | 2017-025407 | A | 2/2017 |
| TW | 201538771 | A | 10/2015 |
| WO | 02/19395 | A1 | 3/2002 |
| WO | 2012/003339 | A1 | 1/2012 |
| WO | 2015/134108 | A1 | 9/2015 |

OTHER PUBLICATIONS

Machine Translation CN 102222613A (Year: 2011).*
Office Action issued in Taiwanese Application No. 11020551030, dated Jun. 11, 2021.

* cited by examiner

NEGATIVE ION IRRADIATION DEVICE

RELATED APPLICATIONS

The content of Japanese Patent Application No. 2019-118676, on the basis of which priority benefits are claimed in an accompanying application data sheet, is in its entirety incorporated herein by reference.

BACKGROUND

Technical Field

A certain embodiment of the present invention relates to a negative ion irradiation device.

Description of Related Art

A device disclosed in the related art is known as a negative ion irradiation device. The negative ion irradiation device includes a gas supply unit that supplies a gas, which is a raw material for negative ions, into a chamber and a plasma generating portion that generates plasma in the chamber. The plasma generating portion generates negative ions by intermittently generating plasma in the chamber, and thereby an object is irradiated.

SUMMARY

According to an embodiment of the present invention, there is provided a negative ion irradiation device in which an object is irradiated with a negative ion. The negative ion irradiation device includes a chamber that allows the negative ion to be generated therein, a gas supply unit that supplies a gas which is a raw material for the negative ion, a plasma generating portion that generates plasma in the chamber, a voltage applying unit that applies a voltage to the object, and a control unit that performs control of the gas supply unit, the plasma generating portion, and the voltage applying unit. The control unit controls the gas supply unit to supply the gas into the chamber. The control unit controls the plasma generating portion to generate the plasma in the chamber and to generate the negative ion by stopping the generation of the plasma. The control unit controls the voltage applying unit to start applying the voltage to the object during generation of the plasma and to continue applying the voltage to the object after the generation of the plasma is stopped.

DETAILED DESCRIPTION

In a negative ion irradiation device, ions are implanted into an object first. Then, the object is heated and annealing treatment is performed in some cases. However, annealing treatment is performed by a device different from the negative ion irradiation device. Therefore, there is a problem that efforts, costs, and time are required for annealing treatment.

It is desirable to provide a negative ion irradiation device that can easily perform annealing treatment.

In the negative ion irradiation device according to the embodiment of the present invention, a control unit controls a gas supply unit to supply a gas into a chamber. The control unit controls a plasma generating portion to generate plasma in the chamber, and to generate negative ions with electrons and the gas by stopping the generation of the plasma. Thus, an object is irradiated with the negative ions. Herein, the control unit controls a voltage applying unit to start applying a voltage to the object during the generation of the plasma and to continue applying the voltage to the object even after the generation of the plasma is stopped. When the application of the voltage to the object is started during the generation of the plasma, the object is irradiated with the electrons existing in the chamber due to an effect of the applied voltage. Accordingly, as a surface of the object is irradiated with the electrons, the surface of the object is heated due to electron impact. Since the application of the voltage to the object is continued even after the generation of the plasma is stopped, the surface of the object is irradiated with the generated negative ions and the generated negative ions are implanted into the object. In this case, since the surface of the object is heated in advance, the implanted negative ions enter the inside of the object with a concentration gradient due to thermal diffusion. As described above, by heating the object using the electrons, it is possible to make annealing treatment unnecessary in another device after negative ion irradiation. Annealing treatment can be easily performed as described above.

The control unit may control the voltage applying unit to start applying the voltage to the object after a predetermined time has elapsed from start of generation of the plasma. Accordingly, it is possible to avoid an effect of a surge that considerably occurs immediately after plasma generation.

Hereinafter, a negative ion irradiation device according to an embodiment of the present invention will be described with reference to the accompanying drawings. In the description of the drawings, the same elements will be assigned with the same reference signs, and redundant description will be omitted.

Figure 1:
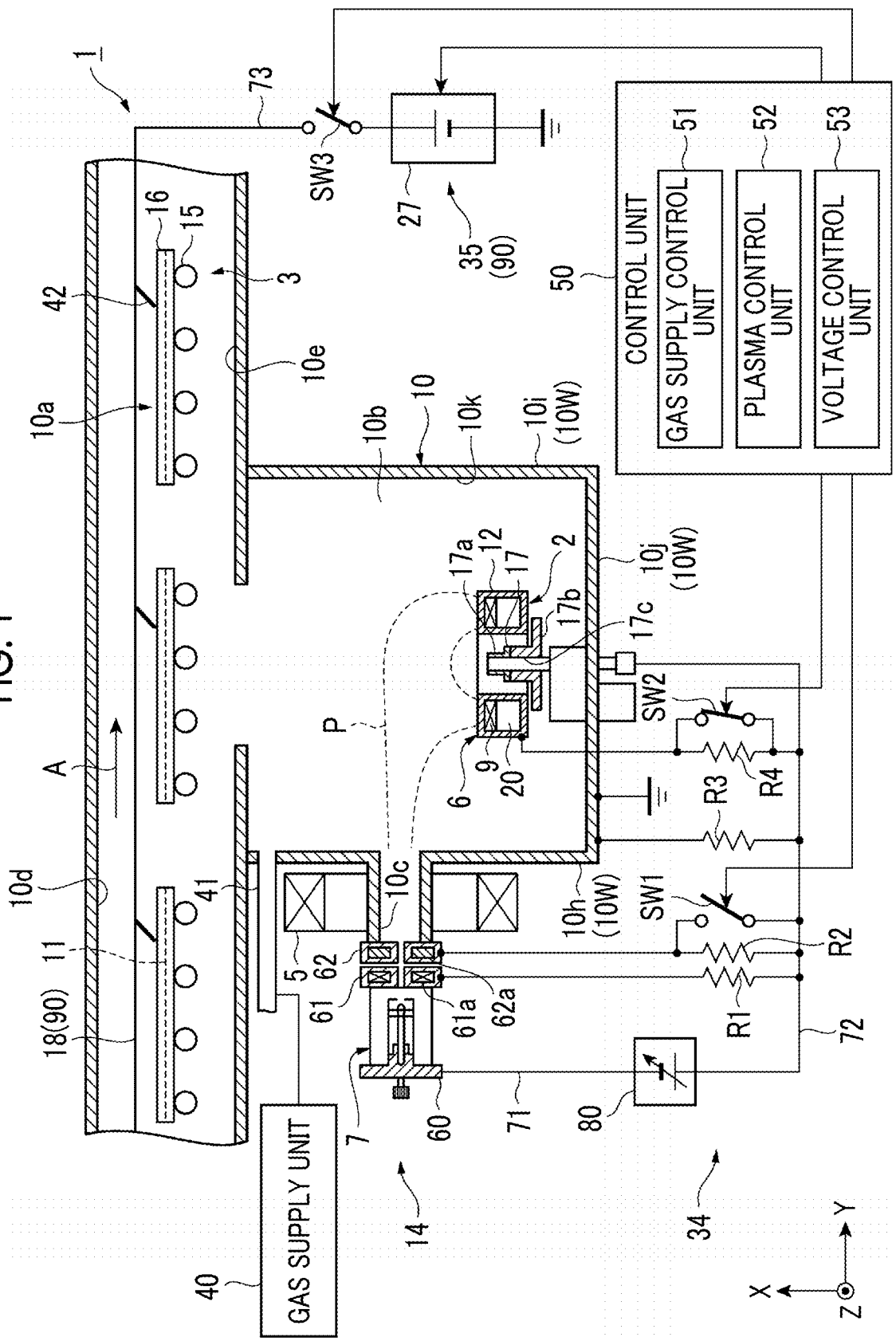
FIG. 1 is a schematic sectional view showing a configuration of a negative ion irradiation device according to an embodiment of the present invention, and is a view showing an operating state when generating plasma.
Figure 2:
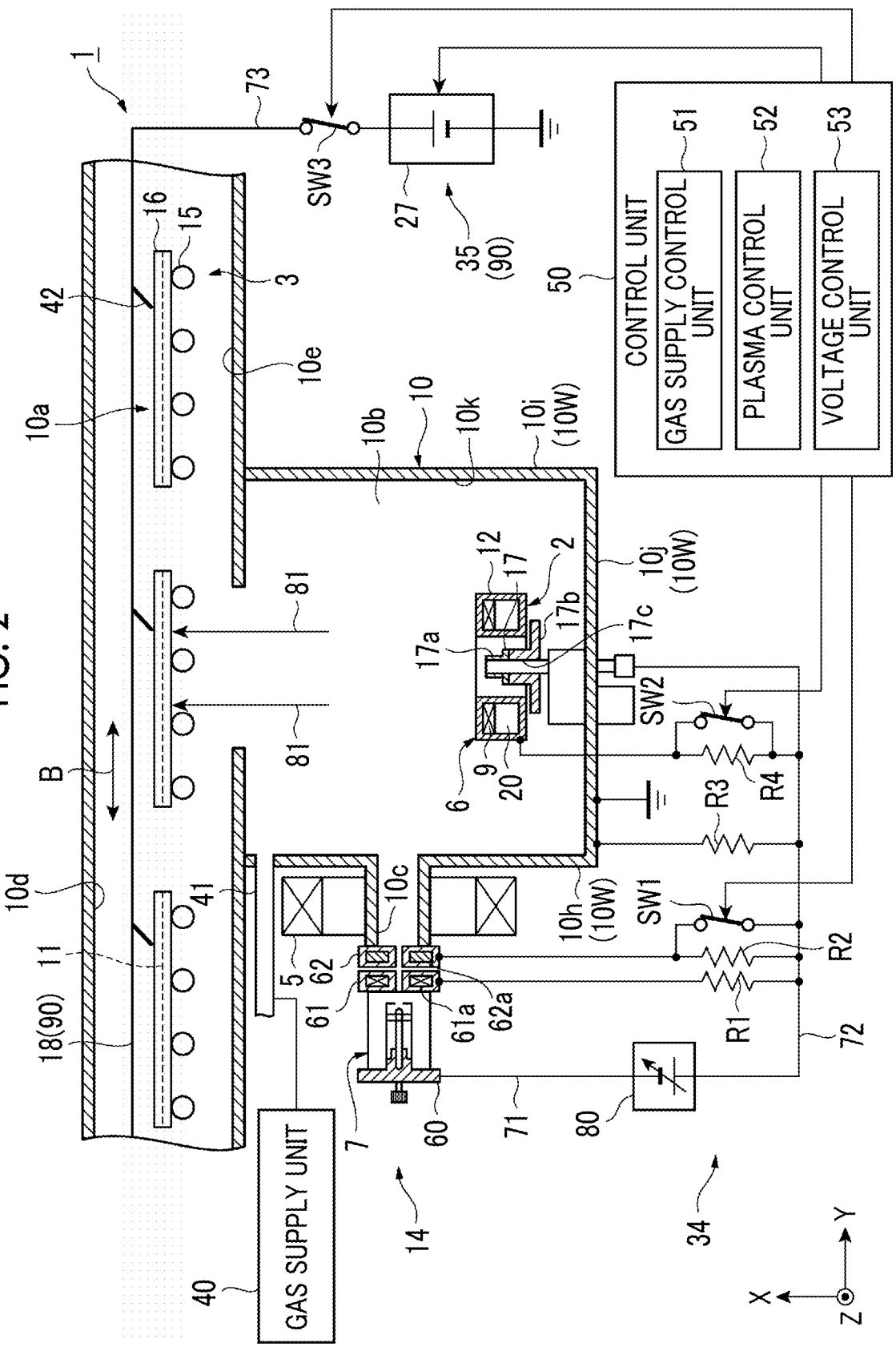
FIG. 2 is a schematic sectional view showing the configuration of the negative ion irradiation device of FIG. 1, and is a view showing an operating state when the generation of the plasma is stopped.

First, a configuration of the negative ion irradiation device according to the embodiment of the present invention will be described with reference to FIGS. 1 and 2. FIGS. 1 and 2 are schematic sectional views showing the configuration of the negative ion irradiation device according to the embodiment. FIG. 1 shows an operating state when plasma is generated, and FIG. 2 shows an operating state when the generation of the plasma is stopped.

As shown in FIGS. 1 and 2, a negative ion irradiation device 1 of the embodiment is a device in which a film forming technique used in a so-called ion plating method is applied to negative ion irradiation. By switching modes, the negative ion irradiation device 1 can also operate in a film forming mode in which a film is formed on a substrate 11, in addition to a negative ion irradiation mode. For convenience of description, FIGS. 1 and 2 show an XYZ coordinate system. A Y-axis direction is a direction in which a substrate to be described later is transported. An X-axis direction is a substrate thickness direction. A Z-axis direction is a direction perpendicular to the Y-axis direction and the X-axis direction.

The negative ion irradiation device 1 may be a so-called horizontal type negative ion irradiation device in which the substrate 11 is disposed and transported in a vacuum chamber 10 (chamber) such that a plate thickness direction of the substrate 11 (object) is a substantially vertical direction. In this case, the Z-axis and Y-axis directions are horizontal directions, and the X-axis direction is the vertical direction and the plate thickness direction. The negative ion irradiation device 1 may be a so-called vertical type negative ion irradiation device in which the substrate 11 is disposed and transported in the vacuum chamber 10 in a state where the substrate 11 is upright or is inclined from an upright state such that the plate thickness direction of the substrate 11 is the horizontal direction (the X-axis direction in FIGS. 1 and 2). In this case, the X-axis direction is the horizontal direction and the plate thickness direction of the substrate 11, the Y-axis direction is the horizontal direction, and the Z-axis direction is the vertical direction. Hereinafter, the negative ion irradiation device according to the embodiment of the present invention will be described as an example of the horizontal type negative ion irradiation device.

The negative ion irradiation device 1 includes the vacuum chamber 10, a transport mechanism 3 (disposing unit), a plasma generating portion 14, a gas supply unit 40, a circuit unit 34, a voltage applying unit 90, and a control unit 50.

The vacuum chamber 10 is a member for accommodating the substrate 11 and performing film forming processing. The vacuum chamber 10 includes a transporting chamber 10a for transporting the substrate 11, a generation chamber 10b for generating negative ions, and a plasma port 10c for allowing plasma P irradiated from a plasma gun 7 in a beam shape to be received by the vacuum chamber 10. The transporting chamber 10a, the generation chamber 10b, and the plasma port 10c communicate with each other. The transporting chamber 10a is set along a predetermined transport direction (an arrow A in FIG. 1) (Y-axis). In addition, the vacuum chamber 10 is made of a conductive material, and is connected to the ground potential. The transporting chamber 10a is provided with a heating unit 30 for heating the substrate 11. In the transporting chamber 10a, the heating unit 30 is provided on an upstream side in the transport direction from a communicating portion with the generation chamber 10b. Therefore, the substrate 11 in a heated state is irradiated with negative ions from the generation chamber 10b.

The generation chamber 10b includes, as a wall portion 10W, a pair of side walls along the transport direction (arrow A), a pair of side walls 10h and 10i along a direction (Z-axis direction) intersecting the transport direction (arrow A), and a bottom wall 10j disposed to intersect the X-axis direction.

The transport mechanism 3 transports, in the transport direction (arrow A), a substrate holding member 16 that holds the substrate 11 in a state of facing the generation chamber 10b. The transport mechanism 3 functions as the disposing unit that disposes the substrate 11. For example, the substrate holding member 16 is a frame body that holds an outer peripheral edge of the substrate 11. The transport mechanism 3 is configured by a plurality of transport rollers 15 provided in the transporting chamber 10a. The transport rollers 15 are disposed at equal intervals along the transport direction (arrow A), and transport the substrate holding member 16 in the transport direction (arrow A) while supporting the substrate holding member. As the substrate 11 which is subjected to negative ion irradiation, for example, a substrate including a film of ITO, IWO, ZnO, $Ga_2O_3$, AlN, GaN, or SiON formed on a surface of a base material is adopted. In a case of the film forming mode, a plate-shaped member such as a glass substrate and a plastic substrate is adopted as the substrate 11. The film described above is formed on such a substrate 11.

Next, a configuration of the plasma generating portion 14 will be described in detail. The plasma generating portion 14 generates plasma and electrons in the vacuum chamber 10. The plasma generating portion 14 includes the plasma gun 7, a steering coil 5, and a hearth mechanism 2.

The plasma gun 7 is, for example, a pressure gradient type plasma gun, and a main body portion thereof is connected to the generation chamber 10b via the plasma port 10c provided in a side wall of the generation chamber 10b. The plasma gun 7 generates the plasma P in the vacuum chamber 10. The plasma P generated by the plasma gun 7 exits in a beam shape from the plasma port 10c into the generation chamber 10b. Accordingly, the plasma P is generated in the generation chamber 10b.

One end of the plasma gun 7 is closed by a cathode 60. A first intermediate electrode 61 (grid) and a second intermediate electrode 62 (grid) are concentrically disposed between the cathode 60 and the plasma port 10c. An annular permanent magnet 61a for converging the plasma P is built in the first intermediate electrode 61. An electromagnet coil 62a is also built in the second intermediate electrode 62 in order to converge the plasma P.

When generating negative ions, the plasma gun 7 intermittently generates the plasma P in the generation chamber 10b. Specifically, the plasma gun 7 is controlled by the control unit 50 to be described later such that the plasma P is intermittently generated in the generation chamber 10b. This control will be described in detail in the description of the control unit 50.

The steering coil 5 is provided around the plasma port 10c on which the plasma gun is mounted. The steering coil 5 guides the plasma P into the generation chamber 10b. The steering coil 5 is excited by a steering coil power supply (not shown).

The hearth mechanism 2 is a mechanism that guides the plasma P from the plasma gun to a desired position. The hearth mechanism 2 includes a main hearth 17 and a wheel hearth 6. The main hearth 17 functions as an anode that holds a film forming material in a case of forming a film using the negative ion irradiation device 1. The main hearth 17 evaporates the film forming material by guiding the plasma to the film forming material or around the film forming material, and forms a film by attaching the plasma to the substrate 11. However, when generating negative ions, the plasma is guided to the wheel hearth 6 such that the plasma P is not guided to the film forming material. Therefore, in a case where the negative ion irradiation device 1 does not form a film and only performs negative ion irradiation, the film forming material may not be held by the main hearth 17.

The wheel hearth 6 is an anode including an electromagnet for guiding the plasma P. The wheel hearth 6 is disposed around a filling portion 17a of the main hearth 17. The wheel hearth 6 includes an annular coil 9, an annular permanent magnet portion 20, and an annular container 12, and the coil 9 and the permanent magnet portion 20 are housed in the container 12. Although the coil 9 and the permanent magnet portion 20 are provided in this order in an X-negative direction as seen from the transport mechanism 3 in the embodiment, the permanent magnet portion 20 and the coil 9 may be provided in this order in the X-negative direction.

The gas supply unit 40 is disposed outside the vacuum chamber 10. The gas supply unit 40 supplies a gas into the vacuum chamber 10 through a gas supply port 41 provided in the side wall (for example, the side wall 10h) of the generation chamber 10b. The gas supply unit 40 supplies a gas that is a raw material for negative ions. As the gas, for example, $O_2$ which is a raw material for negative ions such as $O^-$, $NH_2$ and $NH_4$ which are raw materials for negative ions of nitride such as $NH^-$, and $C_2H_6$ and $SiH_4$ which are raw materials for negative ions such as $C^-$ and $Si^-$ are adopted. The gas also includes a rare gas such as Ar.

It is preferable that a position of the gas supply port 41 is a position near a boundary between the generation chamber 10b and the transporting chamber 10a. In this case, since a gas from the gas supply unit 40 can be supplied to near the boundary between the generation chamber 10b and the transporting chamber 10a, negative ions to be described later are generated near the boundary. Thus, the generated negative ions can be suitably implanted into the substrate 11 in the transporting chamber 10a. The position of the gas supply port 41 is not limited to near the boundary between the generation chamber 10b and the transporting chamber 10a.

The circuit unit 34 includes a variable power supply 80, first wiring 71, second wiring 72, resistors R1 to R4, and short-circuit switches SW1 and SW2.

The variable power supply 80 applies a negative voltage to the cathode 60 of the plasma gun 7 and a positive voltage to the main hearth 17 of the hearth mechanism 2 with the vacuum chamber 10, which is the ground potential, interposed therebetween. Accordingly, the variable power supply 80 generates a potential difference between the cathode 60 of the plasma gun 7 and the main hearth 17 of the hearth mechanism 2.

The first wiring 71 electrically connects the cathode 60 of the plasma gun 7 to a negative potential side of the variable power supply 80. The second wiring 72 electrically connects the main hearth 17 (anode) of the hearth mechanism 2 to a positive potential side of the variable power supply 80.

The resistor R1 has one end electrically connected to the first intermediate electrode 61 of the plasma gun 7 and the other end electrically connected to the variable power supply 80 via the second wiring 72. That is, the resistor R1 is connected in series between the first intermediate electrode 61 and the variable power supply 80.

The resistor R2 has one end electrically connected to the second intermediate electrode 62 of the plasma gun 7 and the other end electrically connected to the variable power supply 80 via the second wiring 72. That is, the resistor R2 is connected in series between the second intermediate electrode 62 and the variable power supply 80.

The resistor R3 has one end electrically connected to the wall portion 10W of the generation chamber 10b and the other end electrically connected to the variable power supply 80 via the second wiring 72. That is, the resistor R3 is connected in series between the wall portion 10W of the generation chamber 10b and the variable power supply 80.

The resistor R4 has one end electrically connected to the wheel hearth 6 and the other end electrically connected to the variable power supply 80 via the second wiring 72. That is, the resistor R4 is connected in series between the wheel hearth 6 and the variable power supply 80.

The short-circuit switches SW1 and SW2 are switching units that are switched between ON and OFF states by receiving a command signal from the control unit 50, respectively.

The short-circuit switch SW1 is connected in parallel with the resistor R2. The short-circuit switch SW1 is turned to an OFF state when generating the plasma P. Accordingly, since the second intermediate electrode 62 and the variable power supply 80 are electrically connected to each other via the resistor R2, a current is unlikely to flow between the second intermediate electrode 62 and the variable power supply 80. As a result, the plasma P from the plasma gun 7 exits into the vacuum chamber 10. In a case where the plasma P from the plasma gun 7 exits into the vacuum chamber 10, a current may be made unlikely to flow to the first intermediate electrode 61, instead of making a current unlikely to flow to the second intermediate electrode 62. In this case, the short-circuit switch SW1 is connected to a first intermediate electrode 61 side instead of a second intermediate electrode 62 side.

On the other hand, the short-circuit switch SW1 is turned to an ON state when stopping the generation of the plasma P. Accordingly, since electrical connection between the second intermediate electrode 62 and the variable power supply 80 is short-circuited, a current flows between the second intermediate electrode 62 and the variable power supply 80. That is, a short-circuit current flows in the plasma gun 7. As a result, the plasma P from the plasma gun 7 does not exit into the vacuum chamber 10.

When generating negative ions, as the ON and OFF states of the short-circuit switch SW1 are switched at a predetermined interval by the control unit 50, the plasma P from the plasma gun 7 is intermittently generated in the vacuum chamber 10. That is, the short-circuit switch SW1 is a switching unit that switches between supplying and blocking of the plasma P into the vacuum chamber 10.

The short-circuit switch SW2 is connected in parallel with the resistor R4. The short-circuit switch SW2 is switched between ON and OFF states by the control unit 50 depending on whether the plasma P is guided to a main hearth 17 side or a wheel hearth 6 side. When the short-circuit switch SW2 is turned to an ON state, electrical connection between the wheel hearth 6 and the variable power supply 80 is short-circuited. Thus, a current is more likely to flow to the wheel hearth 6 than to the main hearth 17. Accordingly, the plasma P is likely to be guided to the wheel hearth 6. On the contrary, when the short-circuit switch SW2 is turned to an OFF state, the wheel hearth 6 and the variable power supply 80 are electrically connected to each other via the resistor R4. Thus, a current is more likely to flow to the main hearth 17 than to the wheel hearth 6, and the plasma P is likely to be guided to the main hearth 17 side. The short-circuit switch SW2 is kept in an ON state when generating negative ions. The short-circuit switch SW2 is kept in an OFF state when forming a film.

The voltage applying unit 90 can apply a positive voltage to the substrate 11 (object) after film formation. The voltage applying unit 90 includes a bias circuit 35 and a trolley wire 18.

The bias circuit 35 is a circuit for applying a positive bias voltage to the substrate 11 after film formation. The bias circuit 35 includes a bias power supply 27 that applies a positive bias voltage (hereinafter, also simply referred to as a "bias voltage") to the substrate 11, third wiring 73 that electrically connects the bias power supply 27 to the trolley wire 18, and a short-circuit switch SW3 that is provided on the third wiring 73. The bias power supply 27 applies, as a bias voltage, a voltage signal (periodic electric signal) that is a rectangular wave that periodically increases and decreases. The bias power supply 27 is configured to be able to change frequency of a bias voltage to be applied through control by the control unit 50. The third wiring 73 has one end connected to a positive potential side of the bias power supply 27 and the other end connected to the trolley wire 18. Accordingly, the third wiring 73 electrically connects the trolley wire 18 to the bias power supply 27.

The short-circuit switch SW3 is connected in series between the trolley wire 18 and the positive potential side of the bias power supply 27 by the third wiring 73. The short-circuit switch SW3 is a switching unit that switches between applying and not applying of a bias voltage to the trolley wire 18. The ON and OFF states of the short-circuit switch SW3 are switched by the control unit 50. The short-circuit switch SW3 is turned to an ON state at a predetermined timing when generating negative ions. When the short-circuit switch SW3 is turned to an ON state, the trolley wire 18 and the positive potential side of the bias power supply 27 are electrically connected to each other, and a bias voltage is applied to the trolley wire 18.

On the contrary, the short-circuit switch SW3 is turned to an OFF state at a predetermined timing when generating negative ions. When the short-circuit switch SW3 is turned to an OFF state, the trolley wire 18 and the bias power supply 27 are electrically disconnected to each other, and a bias voltage is not applied to the trolley wire 18.

The trolley wire 18 is an overhead wire for supplying power to the substrate holding member 16. The trolley wire 18 is provided in the transporting chamber 10a to be extended in the transport direction (arrow A). The trolley wire 18 allows power to be supplied to the substrate holding member 16 through a power supplying brush 42 by staying in contact with the power supplying brush 42 provided on the substrate holding member 16. The trolley wire 18 is configured by, for example, a stainless steel wire.

The control unit 50 is a device that controls the entire negative ion irradiation device 1, and includes an electronic control unit (ECU) that comprehensively manages the entire device. The ECU is an electronic control unit including a central processing unit (CPU), a read only memory (ROM), a random access memory (RAM), and a controller area network (CAN) communication circuit. In the ECU, for example, various functions are realized by loading a program stored in the ROM into the RAM and causing the CPU to perform the program loaded into the RAM. The ECU may be configured by a plurality of electronic units.

The control unit 50 is disposed outside the vacuum chamber 10. In addition, the control unit 50 includes a gas supply control unit 51 that controls gas supply by the gas supply unit 40, a plasma control unit 52 that controls the generation of the plasma P by the plasma generating portion 14, and a voltage control unit 53 that controls the application of a bias voltage by the voltage applying unit 90.

The gas supply control unit 51 controls the gas supply unit 40 to supply a gas into the generation chamber 10b. Next, the plasma control unit 52 of the control unit 50 controls the plasma generating portion 14 to intermittently generate the plasma P from the plasma gun 7 in the generation chamber 10b. For example, as the ON and OFF states of the short-circuit switch SW1 are switched at a predetermined interval by the control unit 50, the plasma P from the plasma gun 7 is intermittently generated in the generation chamber 10b.

When the short-circuit switch SW1 is in an OFF state (state of FIG. 1), the plasma P from the plasma gun 7 exits into the generation chamber 10b. Thus, the plasma P is generated in the generation chamber 10b. The plasma P has neutral particles, positive ions, negative ions (in a case where there is a negative gas such as an oxygen gas), and electrons as constituent substances. Therefore, electrons are generated in the generation chamber 10b. When the short-circuit switch SW1 is in an ON state (state of FIG. 2), the plasma P from the plasma gun 7 does not exit into the generation chamber 10b. Thus, an electron temperature of the plasma P in the generation chamber 10b sharply declines. For this reason, the electrons are likely to be attached to particles of a gas supplied in the generation chamber 10b. Accordingly, negative ions are efficiently generated in the generation chamber 10b.

Figure 4A:
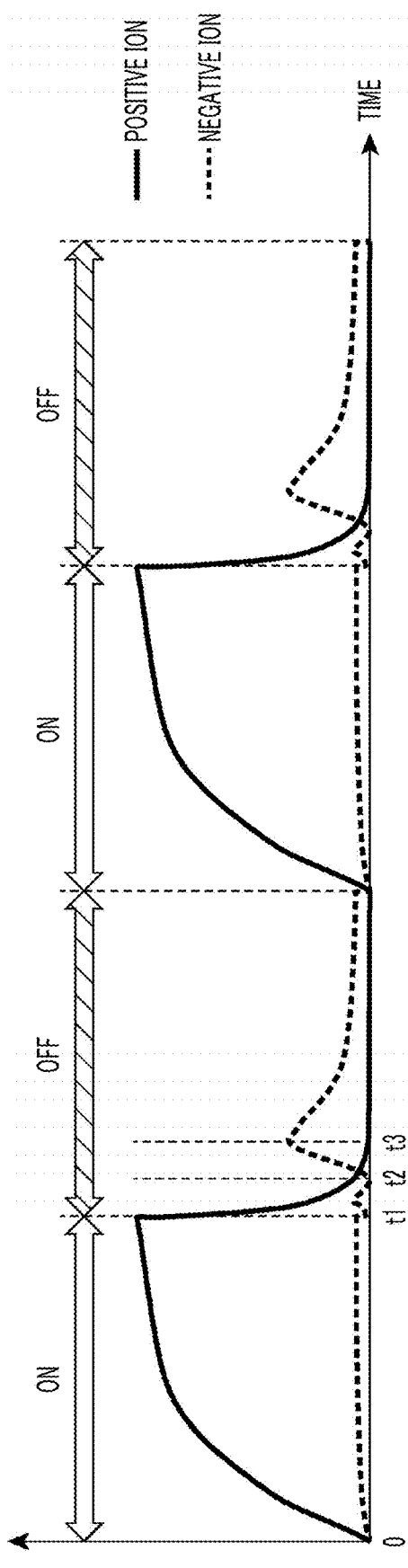
FIG. 4A is a graph showing ON and OFF timings of plasma and a state where positive ions and negative ions fly to an object.

FIG. 4A is a graph showing ON and OFF timings of the plasma P and a state where positive ions and negative ions fly to an object. In FIG. 4A, a region written as "ON" indicates a generation state of the plasma P, and a region written as "OFF" indicates a stopped state of generation of the plasma P. The generation of the plasma P is stopped at a timing of a time t1. During the generation of the plasma P, many positive ions are generated. In this case, many electrons are also generated in the vacuum chamber 10. Then, when the generation of the plasma P is stopped, the number of positive ions sharply decreases. In this case, the number of electrons also decreases. The number of negative ions sharply increases from a time t2 when a predetermined time has elapsed after the generation of the plasma P is stopped and reaches a peak at a time t3. The number of positive ions and the number of electrons decrease after the generation of the plasma P is stopped. Near the time t3, the number of positive ions becomes almost the same as the number of negative ions and the electrons almost disappear. For this reason, when a positive bias is applied to the object after the time t3, negative ion irradiation is predominant.

The control unit 50 controls the application of a bias voltage by the voltage applying unit 90. The control unit 50 causes the voltage applying unit 90 to apply a bias voltage at a predetermined timing. A timing when the voltage applying unit 90 starts applying a bias voltage is set in advance by the control unit 50. As the voltage applying unit 90 applies a positive bias voltage to the substrate 11, negative ions in the vacuum chamber 10 are guided to the substrate 11. Accordingly, the substrate 11 is irradiated with the negative ions. In addition, in a case where there are electrons in the vacuum chamber 10, the electrons are also guided to the substrate 11.

Figure 4B:
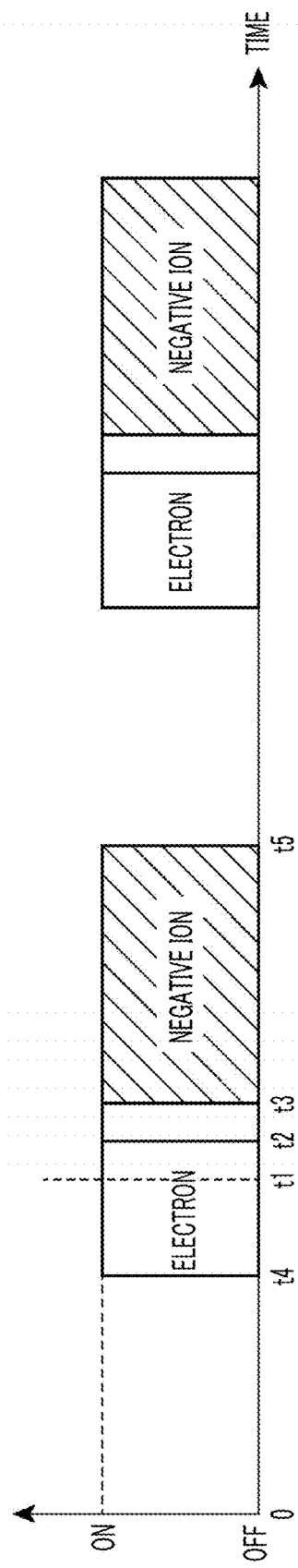
FIG. 4B shows ON and OFF states of a bias voltage.

Herein, the timing when the voltage applying unit 90 starts applying a bias voltage will be described with reference to FIGS. 4A and 4B. FIG. 4B shows ON and OFF states of a bias voltage. FIG. 4B shows particle species with which the substrate 11 is irradiated. The substrate 11 is irradiated with electrons in a region written as "electron", and the substrate 11 is irradiated with negative ions in a region written as "negative ion". In addition, the substrate 11 is irradiated with electrons and negative ions in a region between the region written as "electron" and the region written as "negative ion".

The control unit 50 controls the voltage applying unit 90 to start applying a bias voltage to the substrate 11 during the generation of the plasma P. That is, the control unit 50 starts the application of a bias voltage before the time t1 when the generation of the plasma P is stopped. The control unit 50 controls the voltage applying unit 90 to start applying a bias voltage to the substrate 11 after a predetermined time has elapsed from the start of generation of the plasma P. In FIG. 4B, the generation of the plasma P is started at a timing of "time=0", and then the application of a bias voltage is started at a time t4 (<the time t1). Although a timing of the start of application of a bias voltage to the substrate 11 may be set to any time insofar as the timing is at least after the starting time (=0) of the generation of the plasma P, for example, the timing may be a timing when a surge immediately after the generation of the plasma P is avoided, or may be set between 20 μms and 2 ms from the start of generation of the plasma P.

In addition, the control unit 50 continues the application of a bias voltage to the substrate 11 even after the generation of the plasma P is stopped (after the time t1). The control unit 50 stops the application of a bias voltage at a time t5 which is a timing when the next generation of the plasma P is started. However, a timing of stopping the application of a bias voltage is not particularly limited, and the application of a bias voltage may be stopped at a timing when negative ions in the vacuum chamber 10 have disappeared.

Next, particles with which the substrate 11 is irradiated will be described. As shown in FIG. 4B, the substrate 11 is irradiated with electrons in the generation chamber 10b as the application of a bias voltage is started at the time t4. Accordingly, a surface of the substrate 11 is heated. Electron irradiation continues even after the generation of the plasma P is stopped at the time t1. After the time t2, since negative ions are generated in the generation chamber 10b, the substrate 11 is irradiated with electrons and negative ions. Since the number of electrons decreases after time t3, the substrate 11 is irradiated with negative ions.

Figure 5A:
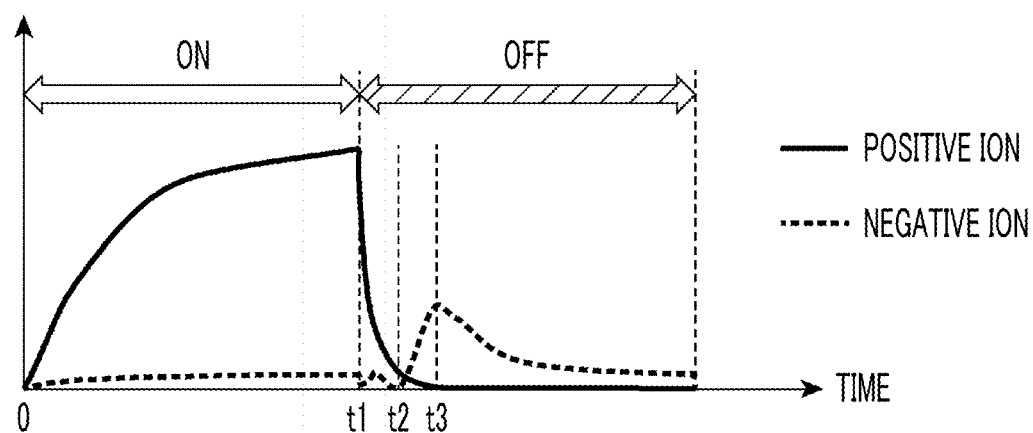
FIG. 5A is a graph showing the ON and OFF timings of the plasma and a state where the positive ions and the negative ions fly to the object.
Figure 5B:
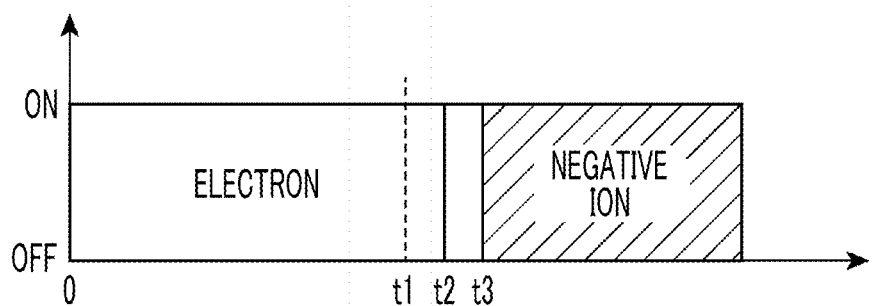
FIG. 5B shows the ON and OFF states of the bias voltage.
Figure 5C:
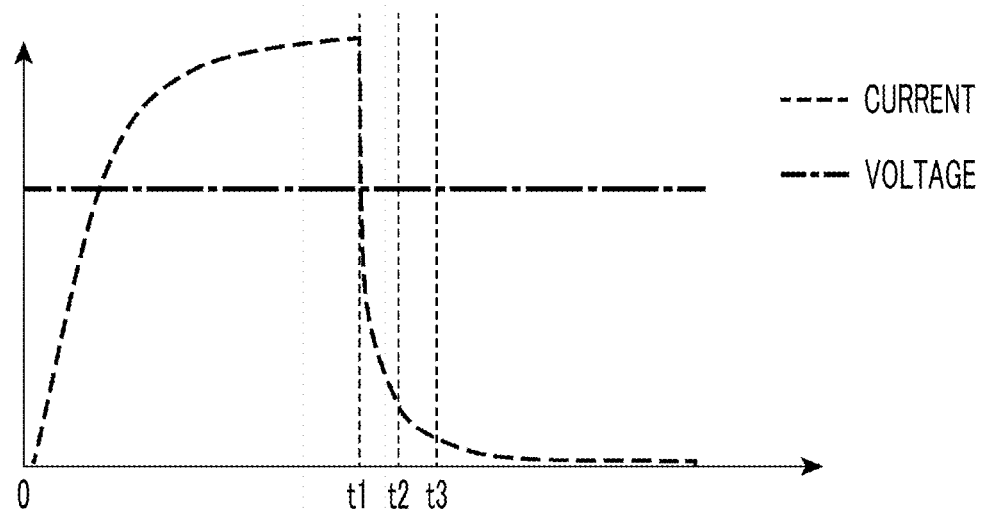
FIG. 5C shows a relationship between the bias voltage and a current.
Figure 6A:
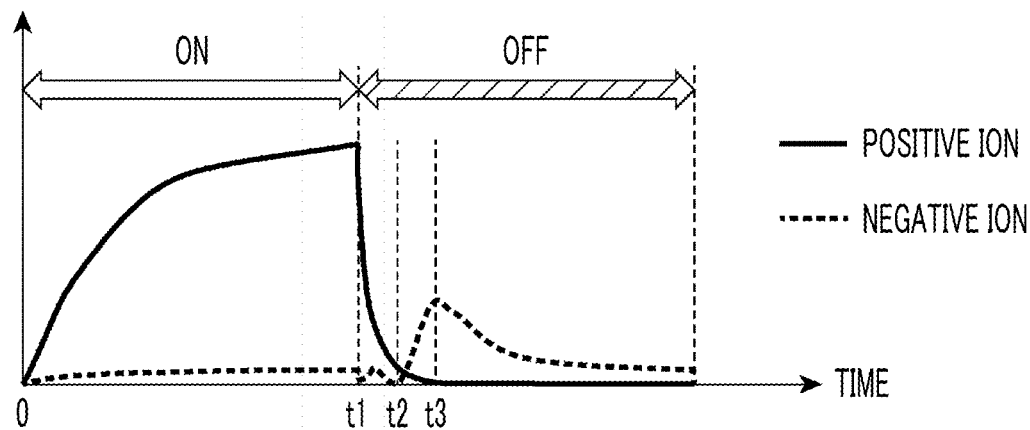
FIG. 6A is a graph showing the ON and OFF timings of the plasma and a state where the positive ions and the negative ions fly to the object.
Figure 6B:
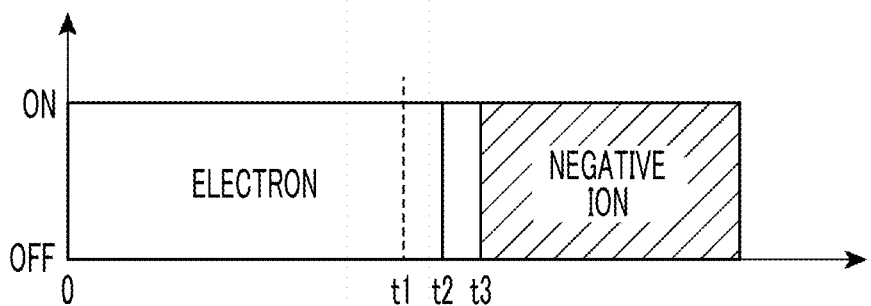
FIG. 6B shows the ON and OFF states of the bias voltage.
Figure 6C:
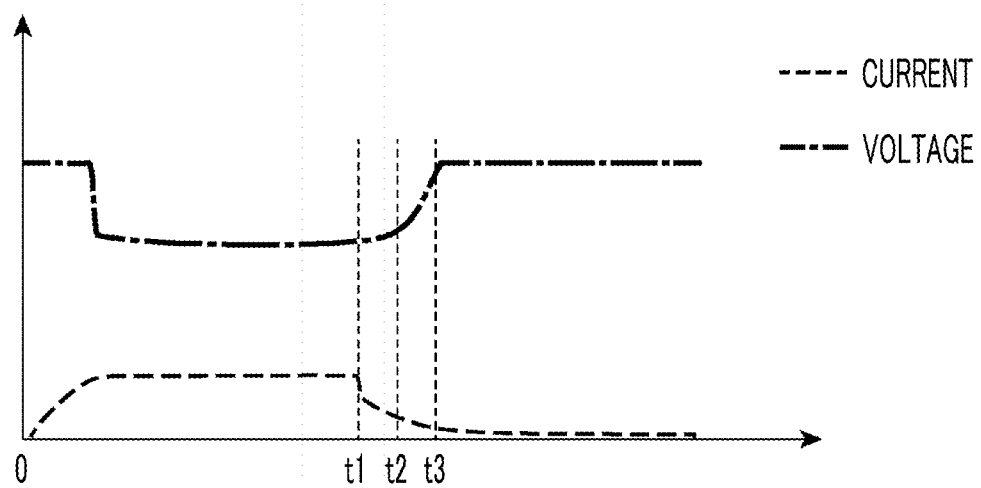
FIG. 6C shows a relationship between the bias voltage and the current.

Next, a relationship between a bias voltage and a current will be described with reference to FIGS. 5A to 6C. FIGS. 5A to 5C are graphs showing a relationship between a bias voltage and a current in a case where the bias power supply 27 has a large capacity. FIGS. 6A to 6C are graphs showing a relationship between a bias voltage and a current in a case where the bias power supply 27 has a small capacity. FIGS. 5A and 6A are graphs showing ON and OFF timings of the plasma P and a state where positive ions and negative ions fly to an object. FIGS. 5B and 6B show ON and OFF states of a bias voltage. FIGS. 5C and 6C show a relationship between a bias voltage and a current. Measurement points of a bias voltage and a current shown in FIGS. 5C and 6C are points where the substrate 11 is irradiated with a negative ion 81 in FIG. 2. Since FIGS. 5A to 6C show states of a bias voltage and a current in each situation, it is assumed that a bias voltage is turned ON at all times.

As shown in FIG. 5C, when the generation of the plasma P is started at a time 0, electrons are generated in the generation chamber 10b, and the substrate 11 is irradiated with the electrons due to an effect of a bias voltage. When the number of the electrons with which the substrate 11 is irradiated increases, a current flowing in a circuit configuration to which the bias voltage is applied also increases. Therefore, as the number of electrons with which the substrate 11 is irradiated increases after the time 0, the current increases. In this case, since the capacity of the bias power supply 27 is large, no problem occurs even when power sharply increases. Thus, the bias voltage is kept constant. At the time t1, as the number of electrons existing in the generation chamber 10b decreases, an electron irradiation amount declines and the current declines.

As shown in FIG. 6C, as the number of electrons with which the substrate 11 is irradiated increases after the time 0, the current increases. Herein, since the bias power supply 27 has a low capacity, a bias voltage declines from a rated value such that power does not excessively increase, once the current has increased to a predetermined level. At the time t2, as the number of electrons existing in the generation chamber 10b decreases, an electron irradiation amount declines and power declines. Thus, the bias voltage increases by the amount of the decline. Then, since the electron irradiation amount decreases near the time t1, the voltage returns to the rated value, and thereafter the current declines.

Figure 3:
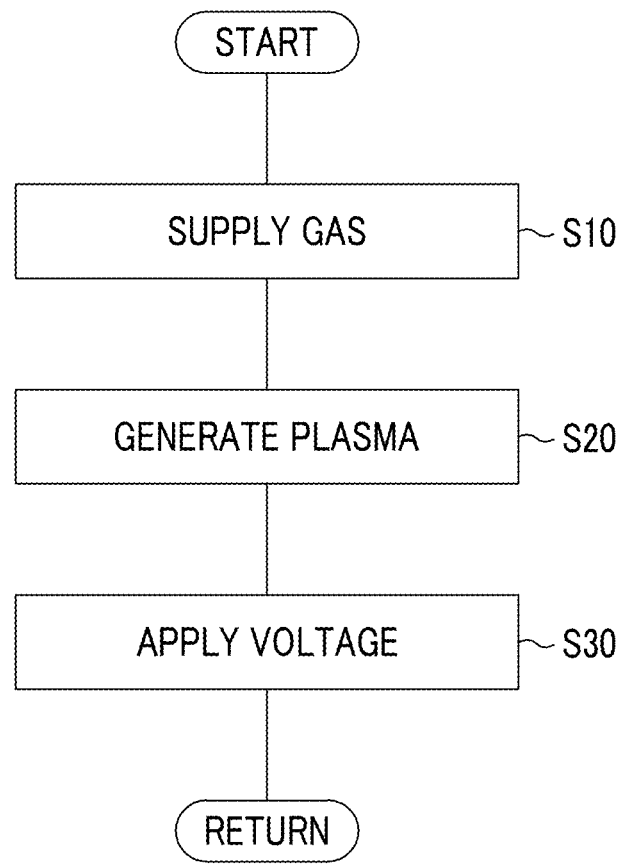
FIG. 3 is a flowchart showing a method of controlling the negative ion irradiation device according to the embodiment.

Next, a method of controlling the negative ion irradiation device 1 will be described with reference to FIG. 3. FIG. 3 is a flowchart showing the method of controlling the negative ion irradiation device 1 according to the embodiment. Herein, a case of irradiating with O⁻ negative ions will be described as an example.

As shown in FIG. 3, the method for controlling the negative ion irradiation device 1 includes a gas supply process S10, a plasma generation process S20, and a voltage application process S30. Each process is performed by the control unit 50.

First, the gas supply control unit 51 of the control unit 50 controls the gas supply unit 40 to supply a gas into the vacuum chamber 10 (gas supply process S10). Accordingly, a state where there is an $O_2$ gas in the generation chamber 10b of the vacuum chamber 10 is caused. After then, the plasma generation process S20 is performed.

The plasma control unit 52 of the control unit 50 controls the plasma generating portion 14 to generate the plasma P and electrons in the vacuum chamber 10, and to generate negative ions with the electrons and the gas by stopping the generation of the plasma P (plasma generation process S20). In a strict sense, negative ions are also generated during plasma generation. When the plasma P and the electrons are generated in the generation chamber 10b of the vacuum chamber 10, the plasma P causes a reaction of "$O_2+e^- \rightarrow 2O+e^-$". After then, when the generation of the plasma P is stopped, an electron temperature sharply declines in the generation chamber 10b, thereby causing a reaction of "$O+e^- \rightarrow O^-$". After the plasma generation process S20 is performed, the voltage application process S30 is performed at a predetermined timing.

The voltage control unit 53 of the control unit 50 controls the voltage applying unit 90 to apply a bias voltage to the substrate 11 (voltage application process S30). The control unit 50 applies a bias voltage to the substrate 11 during the generation of the plasma P. Accordingly, the surface of the substrate 11 is irradiated with electrons in the generation chamber 10b to heat near the surface. The control unit 50 continues the application of a bias voltage to the substrate 11 even after the generation of the plasma P is stopped. Accordingly, as the O⁻ negative ion 81 in the generation chamber 10b is directed toward a substrate 11 side, the substrate 11 is irradiated with the O⁻ negative ion (refer to FIG. 2). Since there are also electrons immediately after the generation of the plasma P is stopped, the substrate 11 is irradiated with both of the electrons and the negative ions. After then, the electron irradiation amount declines, and the substrate 11 is irradiated with almost only the negative ions.

Next, workings and effects of the negative ion irradiation device 1 according to the embodiment will be described.

In the negative ion irradiation device 1 according to the embodiment, the control unit 50 controls the gas supply unit 40 to supply a gas into the vacuum chamber 10. The control unit 50 controls the plasma generating portion 14 to generate the plasma P in the vacuum chamber 10, and to generate negative ions with electrons and a gas by stopping the generation of the plasma P. Thus, the substrate 11 is irradiated with the negative ions. Herein, the control unit 50 controls the voltage applying unit 90 to start applying a bias voltage to the substrate 11 during the generation of the plasma P and to continue applying the bias voltage to the substrate 11 even after the generation of the plasma P is stopped. When the application of the bias voltage to the substrate 11 is started during the generation of the plasma P, the substrate 11 is irradiated with the electrons existing in the vacuum chamber 10 due to an effect of the applied voltage. Accordingly, as the surface of the substrate 11 is irradiated with the electrons, the surface of the substrate 11 is heated due to electron impact. Since the application of the voltage to the substrate 11 is continued even after the generation of the plasma P is stopped, the surface of the substrate 11 is irradiated with the generated negative ions and the generated negative ions are implanted into the substrate 11. In this case, since the surface of the substrate 11 is heated in advance, the implanted negative ions enter the inside of the substrate 11 with a concentration gradient due to thermal diffusion. As described above, by heating the substrate 11 using the electrons, it is possible to make annealing treatment unnecessary in another device after negative ion irradiation. Annealing treatment can be easily performed as described above.

In addition, as a comparative example, there is a method in which the entire substrate 11 is heated by a heater and then negative ion irradiation is performed. However, such a method cannot be adopted in a case where the substrate 11 is a heat-sensitive substrate such as a resin substrate and a substrate including an amorphous layer. On the contrary, since the negative ion irradiation device 1 of the embodiment can heat not only the entire substrate 11 but also only the surface of the substrate 11 through electron irradiation, negative ions can be efficiently implanted also into the heat-sensitive substrate 11 described above.

The control unit 50 may control the voltage applying unit 90 to start applying a voltage to the substrate 11 after a predetermined time has elapsed from the start of generation of the plasma P. Accordingly, it is possible to avoid an effect of a surge that considerably occurs immediately after plasma generation.

Although the embodiment of the present invention has been described hereinbefore, the present invention is not limited to the embodiment, and may be modified without departing from the concept described in each claim or may be applied to other device.

In addition, although the negative ion irradiation device also having a function as an ion plating type film forming device has been described in the embodiment, the negative ion irradiation device may not have the function of the film forming device. Therefore, the plasma P may be guided to, for example, an electrode on a wall portion facing the plasma gun.

For example, although the plasma gun 7 is a pressure gradient type plasma gun in the embodiment, the plasma gun 7 is not limited to the pressure gradient type plasma gun insofar as plasma can be generated in the vacuum chamber 10.

In addition, although only one set of the plasma gun 7 and a point for guiding the plasma P (hearth mechanism 2) is provided in the vacuum chamber 10 in the embodiment, a plurality of sets may be provided. In addition, the plasma P may be supplied from a plurality of plasma guns 7 to one point.

It should be understood that the invention is not limited to the above-described embodiment, but may be modified into various forms on the basis of the spirit of the invention. Additionally, the modifications are included in the scope of the invention.

What is claimed is:

1. A negative ion irradiation device in which an object is irradiated with a negative ion, the negative ion irradiation device comprising:
    a chamber that allows the negative ion to be generated therein;
    a gas supply unit that supplies a gas which is a raw material for the negative ion;
    a plasma generating portion that generates plasma in the chamber;
    a voltage applying unit that applies a positive bias voltage to the object; and
    a control unit that performs control of the gas supply unit, the plasma generating portion, and the voltage applying unit,
    wherein the control unit controls the gas supply unit to supply the gas into the chamber,
    the control unit controls the plasma generating portion to generate the plasma in the chamber and to generate the negative ion by stopping the generation of the plasma, and
    the control unit controls the voltage applying unit to start applying the positive bias voltage to the object during generation of the plasma and to continue applying the positive bias voltage to the object after the generation of the plasma is stopped.

2. The negative ion irradiation device according to claim 1,
    wherein the control unit controls the voltage applying unit to start applying the positive bias voltage to the object after a predetermined time has elapsed from start of generation of the plasma.

* * * * *